US009036353B2

(12) United States Patent
Buckman et al.

(10) Patent No.: US 9,036,353 B2
(45) Date of Patent: May 19, 2015

(54) FLEXIBLE THERMAL INTERFACE FOR ELECTRONICS

(71) Applicant: Northrop Grumman Systems Corporation, Falls Church, VA (US)

(72) Inventors: Clint G. Buckman, Torrance, CA (US); Katrina M. Seitz, Huntington Beach, CA (US); Christofer Bronnenberg, La Mesa, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 320 days.

(21) Appl. No.: 13/685,397

(22) Filed: Nov. 26, 2012

(65) Prior Publication Data

US 2014/0146475 A1     May 29, 2014

(51) Int. Cl.
*H05K 7/20*     (2006.01)
*F28D 15/02*     (2006.01)

(52) U.S. Cl.
CPC ............ *H05K 7/20336* (2013.01); *F28D 15/02* (2013.01); *H05K 7/20254* (2013.01); *H05K 7/20636* (2013.01); *H05K 7/20772* (2013.01)

(58) Field of Classification Search
CPC .................... H05K 7/20336; H05K 7/2029
USPC ............... 361/679.46–679.54, 688–723; 165/80.4–80.5, 104.33, 185; 174/15.2; 257/715, E23.088
See application file for complete search history.

(56) References Cited

U.S. PATENT DOCUMENTS

| | | | |
|---|---|---|---|
| 5,343,940 A * | 9/1994 | Jean | 165/104.33 |
| 5,732,765 A * | 3/1998 | Drolen et al. | 165/41 |
| 6,125,035 A | 9/2000 | Hood, III | |
| 6,160,223 A | 12/2000 | Gates | |
| 6,173,759 B1 | 1/2001 | Galyon | |
| 6,352,104 B1 | 3/2002 | Mok | |
| 6,388,882 B1 | 5/2002 | Hoover | |
| 6,657,121 B2 | 12/2003 | Garner | |
| 7,013,955 B2 * | 3/2006 | Phillips et al. | 165/104.21 |
| 7,019,973 B2 | 3/2006 | Rivera | |
| 7,025,124 B2 | 4/2006 | Wang | |
| 7,193,850 B2 | 3/2007 | Pal | |
| 7,334,630 B2 | 2/2008 | Goodson | |
| 7,545,646 B2 | 6/2009 | Holmberg | |

(Continued)

OTHER PUBLICATIONS

Oshman, "Thermal performance of a flat polymer heat pipe spreader under high acceleration" Journal of Micromechanics and Microengineering, vol. 22, No. 4, 12 pgs, Apr. 2012, ISSN: Publisher IOP Publishing Ltd. UK.

(Continued)

*Primary Examiner* — Zachary M Pape
(74) *Attorney, Agent, or Firm* — John A. Miller; Miller IP Group, PLC

(57) ABSTRACT

A planar heat pipe for removing heat from an electronic device. The heat pipe includes a planar portion defining a cool end of the heat pipe and a plate portion mounted to the electronic device and defining a hot end of the heat pipe. The heat pipe also includes a serpentine portion coupled to the planar portion and the plate portion, where each of the planar portion, the plate portion and the serpentine portion include an internal chamber being in fluid communication with each other and containing a working fluid. The serpentine portion can include a plurality of elements where each element is coupled to an adjacent element at substantially a 90° angle so as to allow the serpentine portion to flex in three-degrees of freedom.

19 Claims, 3 Drawing Sheets

(56) References Cited

U.S. PATENT DOCUMENTS

| | | |
|---|---|---|
| 7,547,124 B2 | 6/2009 | Chang |
| 8,069,907 B2 | 12/2011 | Bryant |
| 2006/0144571 A1* | 7/2006 | Lin et al. .............. 165/104.33 |
| 2007/0070605 A1 | 3/2007 | Straznicky |
| 2007/0204646 A1* | 9/2007 | Gagliano .................... 62/389 |
| 2008/0253082 A1* | 10/2008 | Lev et al. ...................... 361/687 |
| 2009/0065180 A1 | 3/2009 | Wits |
| 2009/0213541 A1 | 8/2009 | Butterbaugh |
| 2010/0319883 A1* | 12/2010 | Facusse ................. 165/104.26 |
| 2011/0139329 A1 | 6/2011 | Clayton |
| 2011/0249400 A1 | 10/2011 | Watamabe |
| 2012/0069526 A1 | 3/2012 | Tissot |
| 2012/0085520 A1* | 4/2012 | Pfaffinger ............. 165/104.26 |
| 2013/0074520 A1* | 3/2013 | Wyatt et al. ..................... 62/3.2 |
| 2014/0138059 A1* | 5/2014 | Ambrose et al. ......... 165/104.26 |

OTHER PUBLICATIONS

Oshman, "The Development of Polymer-Based Flat Heat Pipes" Journal of Microelectromechanical Systems, vol. 20, No. 2, Apr. 2011, IEEE.

Cai, "Heat transfer enhancement of planar pulsating heat pipe device" Published by, American Society of Mechanical Engineers, Proceedings of 2006 ASME International Mechanclal Engineering Congress and Exposition.

Wits, "Advance in Integrated Heat Pipe Technology for Printed Circuit Boards" American Institute of Areonautics and Astronautics, The Netherlands.

* cited by examiner

FLEXIBLE THERMAL INTERFACE FOR ELECTRONICS

BACKGROUND

1. Field

This invention relates generally to a thermal interface for drawing heat from an electronic device and, more particularly, to a planar heat pipe for drawing heat from an electronic device mounted on a printed circuit board (PCB), where the heat pipe includes a plate portion mounted to the device and a flexible portion coupled to the plate portion that compensates for a coefficient of thermal expansion (CTE) mismatch between the heat pipe and the device.

2. Discussion

Solid-state electronic devices generate heat as they operate, which if significant enough can have a damaging affect on the device either through loss of performance or actual damage to the device. As solid-state electronic devices get smaller and operate at higher power, the heat generated by the device becomes more of a concern.

Solid-state electronic devices often employ some type of thermal interface or heat sink that draws heat away from the device during its operation. Often times these heat sinks rely on the flow of air around the heat sink and the device to help reduce the temperature. However, for space-based electronic devices, where air does not exist, removing heat from electronic devices becomes more challenging. Heat sinks for space-based applications typically require the device to be coupled to a large thermally conductive structure that may be bolted or glued to the PCB, and then to the spacecraft structure itself.

Various types of electronic devices, such as large flip-chip, array-area parts, high-power application specific integrated circuits (ASICs), field programmable gate arrays (FPGA), etc., sometimes employ a fine-pitch ball grid array (BGA) or column grid array (CGA) interconnection possibly having several hundred or even a few thousand conductive balls or electrically conductive columns that provides the electrical connection between the device and the leads on the PCB, and also provides the mounting structure for the device to the PCB. In this type of circuit design, it is necessary to provide a heat sink on the opposite side of the device from the PCB so that the heat path for the device is through the top of the device to the thermally conductive structure.

Because there usually is a significant CTE mismatch between the thermally conductive structure being made of metal and the ceramic-based device the conductive structure and the device expand differently when heated, which causes a lateral stress on the BGA or CGA. Because space-based electronic circuits may undergo significant thermal cycling and are often subjected to significant vibrations, that stress on the BGA or CGA affects the life of the device, where eventually connections, such as solder joints, at the BGA or CGB will fail. Non-metallic elastomeric materials have some of the necessary heat removal properties and can be used as heat sinks, but typically rely on significant sustained compressive loads to obtain adequate thermal conduction. The affects of such large static loads are not well established, but are generally assumed to be undesirable. Moreover, the long-term effect of a vacuum environment on the performance of such elastomers is a concern.

A heat pipe is a well known heat-transfer device that has many applications for heat removal. A heat pipe typically includes a sealed pipe or tube made of a high thermally conductive material, such as copper. A chamber within the heat pipe is partially filled with a sintered wicking material and a working fluid, such as water, where air is removed from the remaining volume of the chamber. The working fluid is a liquid at low temperature, and when it is heated by the device, turns into a vapor that travels through the chamber from a hot end of the heat pipe to a cold end of the heat pipe where it condenses back into a liquid. The liquid is then returned to the hot end of the heat pipe through the wicking material under capillary action that occurs as a result of the water being vaporized at the hot end.

DETAILED DESCRIPTION OF THE EMBODIMENTS

The following discussion of the embodiments of the invention directed to a planar heat pipe including a flexible portion is merely exemplary in nature, and is in no way intended to limit the invention or its applications or uses. For example, the planar heat pipe of the present invention has particular application for space-based electronics. However, as well be appreciated by those skilled in the art, the planar heat pipe of the invention will have other applications.

Figure 1:
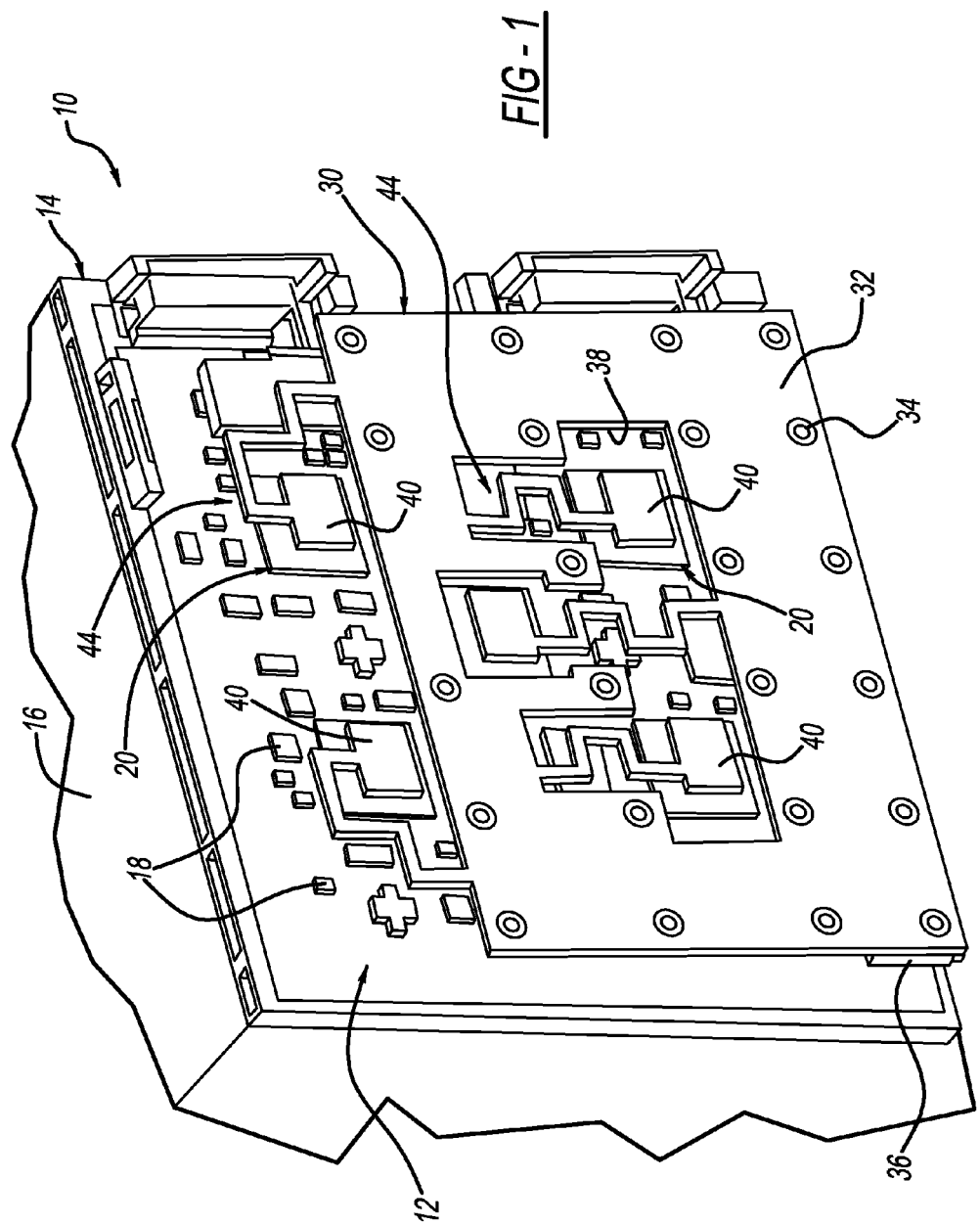
FIG. 1 is a perspective view of electronic hardware including a printed circuit board having a plurality of electronic devices and a planar heat pipe.
Figure 2:
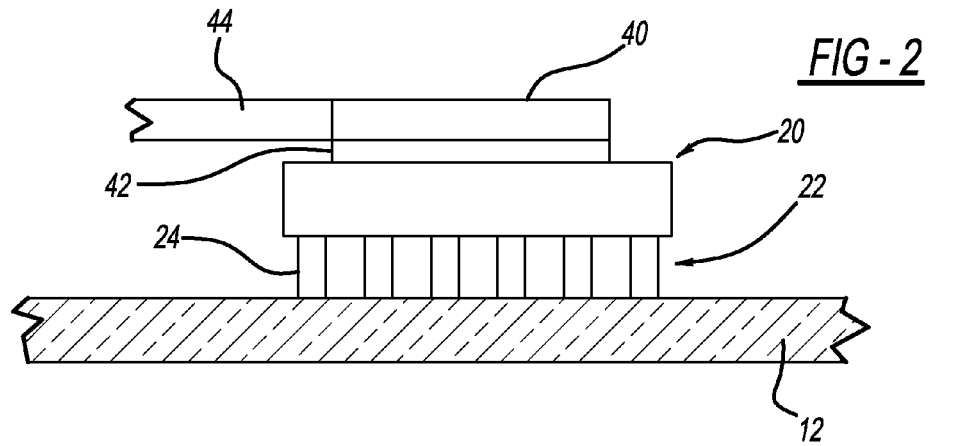
FIG. 2 is a side view showing one of the devices on the printed circuit board in FIG. 1.

FIG. 1 is a perspective view of an electronic hardware 10 intended to be a general representation of any electronic hardware that can be employed in connection with a planar thermal heat pipe of the type discussed herein. In this non-limiting embodiment, the electronic hardware 10 has a spaced-based application in that it will be part of a spacecraft or satellite. The hardware 10 includes a PCB 12 that is mounted to a support or mounting structure 14, which can be any suitable structure, where the support structure is part of a larger system, such as a spacecraft 16. The PCB 12 includes a plurality of electronic devices or components 18 intended to represent any digital chip, solid-state device, circuit, etc. A number of the components 18 are larger specialized ASICs, FPGAs, etc. represented as devices 20 that require heat to be removed from the device 20 for proper operation. Typically, each device 20 will be mounted to the PCB 12 through a BGA, CGB or other related land grid connection where balls, columns or other structures of metal provide the electrical connection between the device 20 and the electrical traces and leads on the PCB 12 in a manner that is well understood by those skilled in art. FIG. 2 is a side view of one the devices 20 coupled to the PCB 12 through a CGA 22 including a plurality of conductive columns 24.

The hardware 10 includes a planar thermal heat pipe 30 that is suitable to effectively draw heat away from the devices 20 and provides the flexibility to eliminate or reduce the stress on the CGA 22 that occurs because of the CTE mismatch between the metal of the heat pipe 30 and the ceramic of the device 20. The term planar as used in connection with the heat pipe 30 refers to the heat pipe 30 having a rectangular or square cross-section.

Figure 3:
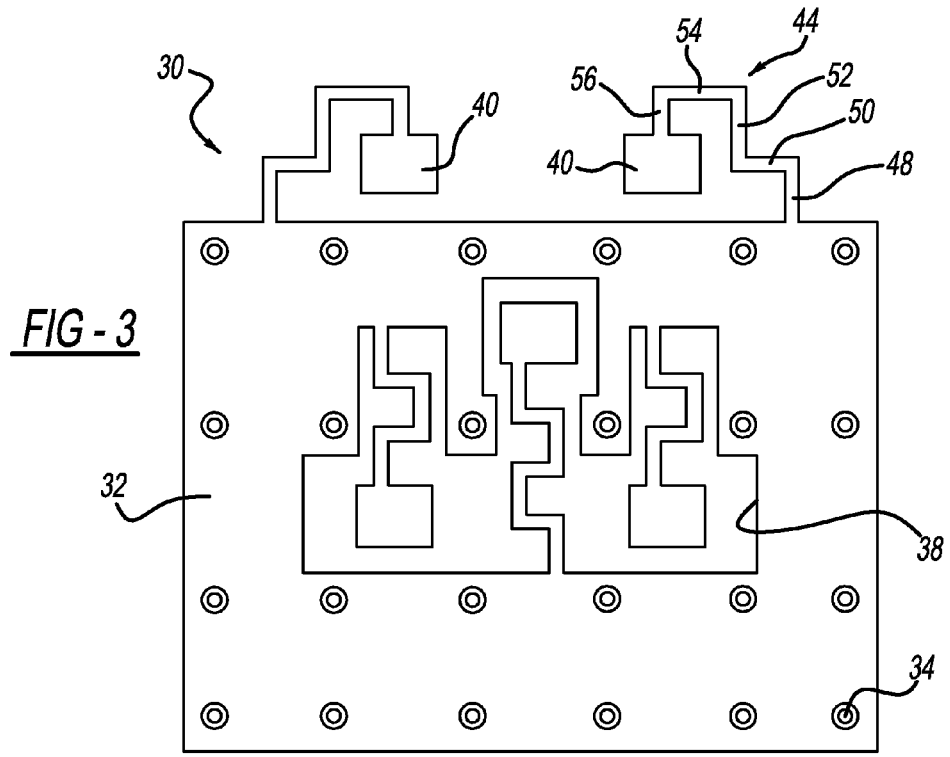
FIG. 3 is a top view of the planar heat pipe separated from the electronic hardware in FIG. 1.

FIG. 3 is a top view of the planar heat pipe 30 removed from the electronic hardware 10. The heat pipe 30 can have any configuration suitable for the particular electronic hardware 10 within the limits of the invention as described herein, where that configuration considers the size of the devices 20, the type of the devices 20, the number of the devices 20, the power of the devices 20, the size of the PCB 12, etc. The heat pipe 30 includes a planar portion 32 mounted to the PCB 12 by a number of bolts 34. A spacer element 36 that may be part of a mounting plate is provided between the heat pipe 30 and the PCB 12 to establish the space necessary to accommodate the devices 20. In this embodiment, the spacer element 36 is provided at a location of the heat pipe 30 sometimes referred to the cool end. The planar portion 32 includes a cut-out section 38 that exposes a number of the devices 20 depending on their position on the PCB 12 so that the planar portion 32 surrounds those devices 20. The size and shape of the cut-out section 38 is specific to a particular heat pipe for a particular PCB. Additionally, some of the components 18 are outside of the planar portion 32 and as such are not within the cut-out section 38. The heat pipe 30 includes a plurality of plate portions 40, where a separate one of the plate portions 40 is mounted to each of the devices 20 by a suitable thermally conductive adhesive 42. In this non-limiting design, the plate portion 40 has the same shape as the device 20, but is slightly smaller. The plate portions 40 operate as the hot end of the heat pipe 30 in that it is the plate portions 40 that draw the heat away from the devices 20.

Each plate portion 40 is coupled to the planar portion 32 by a serpentine flexible portion 44. It is the flexible portion 44 that flexes and moves in three-degrees of freedom in response to the expansion and contraction of the plate portion 40 and vibrations on the hardware 10 to reduce the stress on the CGA 22. Particularly, the flexible portion 44 is able to flex and bend in any direction as the plate portion 40 is heated and expands so that the plate portion 40 moves independent of the planar portion 32 without putting significant stress on the CGA 22.

The flexible portions 44 may have a different length and configuration for the particular device 20, but where the flexible portion 44 includes a plurality of elements, for example, five elements, connected together at general 90° angles with respect to each other. For example, the serpentine flexible portion 44 specifically identified in FIG. 3 includes a first element 48 coupled to the planar portion 32, a second element 50 coupled to the first element 48 at a 90° angle relative thereto, a third element 52 coupled to the second element 50 at a 90° angle relative thereto and extending in the same direction as the first element 48, a fourth element 54 coupled to the third element 52 at a 90° angle relative thereto and extending in the same direction as the second element 50, and a fifth element 56 coupled to the plate portion 40 and the fourth element 54 at a 90° angle and extending in the same direction as the first and third elements 48 and 52. This orientation of the five elements 48-56 allows the portion 44 to flex and bend in every direction to provide flexibility between the plate portion 40 and the planar portion 32. Because the serpentine portion 44 is part of the heat pipe 30, the elements 48-56 can be made relatively short and the bends between the elements 48-56 can be very sharp, which makes the flexible portion 44 able to be compact and only occupy a small area.

All of the planar portion 32, the plate portions 40 and the serpentine flexible portions 44 are interconnected as a planar heat pipe where a thermally conductive outer housing, such as a copper housing, defines an internal chamber that is evacuated of air and includes a sintered wicking material. A working fluid, such as water, is placed in the chamber and when that fluid is heated by the heat generated by the device 20 at the plate portion 40 causes the working fluid to vaporize and travel through the internal chamber to the cold end of the planar portion 32 proximate the spacer element 36 where the fluid is cooled and returns to a liquid form. The capillary action provided by the material caused by vaporization of the fluid draws the liquid water back to the plate portion 40 through the internal chamber in a manner that is well understood by those skilled in the art.

Figure 4:
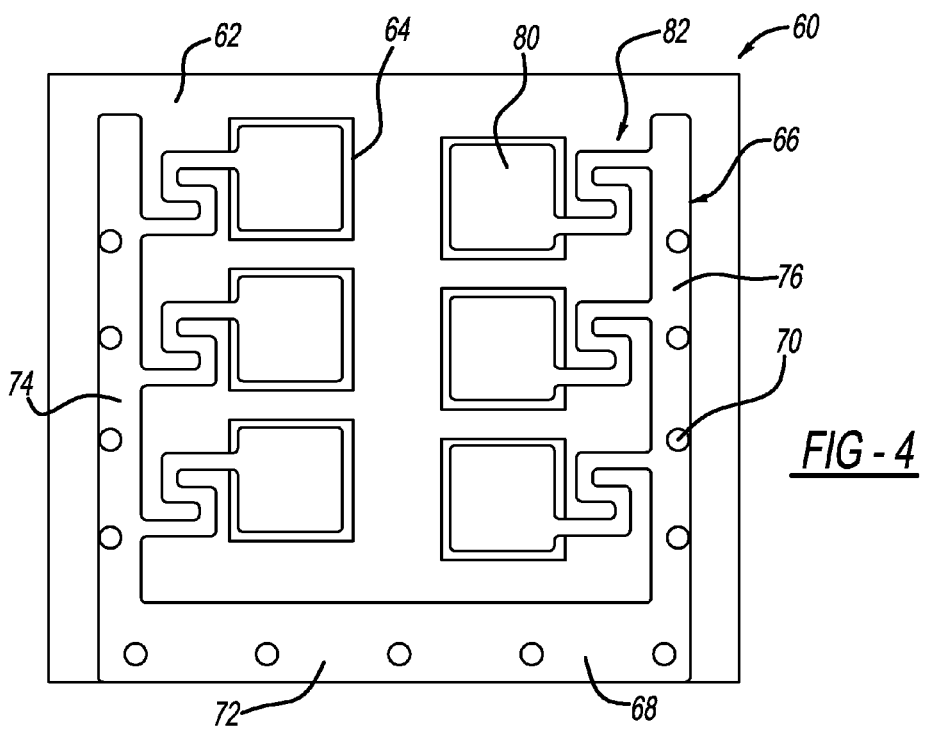
FIG. 4 is a top view of electronic hardware including a printed circuit board having a plurality of electronic devices and a planar heat pipe.

As mentioned above, the heat pipe 30 can be configured in any manner suitable for the particular PCB and devices it is cooling. FIG. 3 is a top view and FIG. 4 is a side view of electronic hardware 60 including a PCB 62 having a plurality of electrical devices 64 to illustrate this. The hardware 60 also includes a planar heat pipe 66 of the type discussed above that includes a planar portion 68 mounted to the PCB 62 by a number of bolts 70 where a gap 84 is defined between the PCB 62 and the heat pipe 66 by spacers 86. The planar portion 68 is a U-shaped member including a base portion 72 and opposing side portions 74 and 76. The heat pipe 66 also includes plate portions 80 where a separate plate portion 80 is mounted to each one of the devices 64 in the manner discussed above. Each plate portion 80 is coupled to one of the side portions 74 or 76 by an S-shaped flexible portion 82 having five separate elements.

Figure 5:
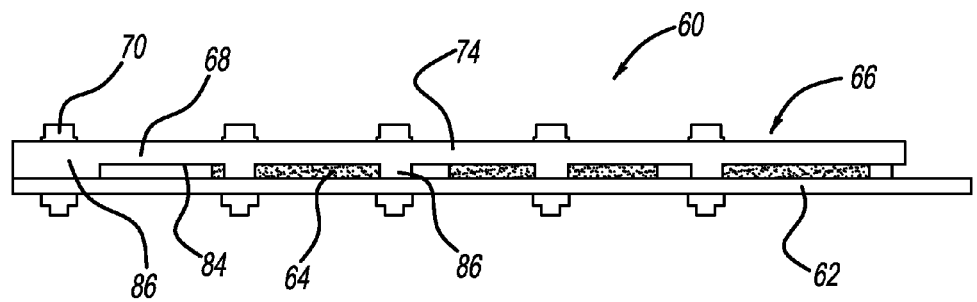
FIG. 5 is a side view of the electronic hardware shown in FIG. 4.
Figure 6:
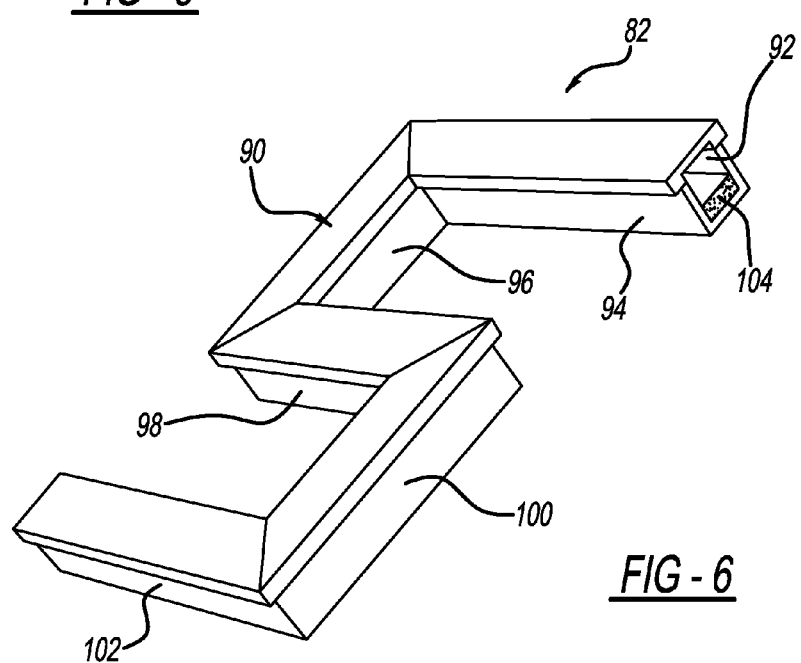
FIG. 6 is a perspective view of a flexible portion of the planar heat pipe shown in FIG. 4.

FIG. 5 is a perspective view of one of the S-shaped portions 82 separated from the heat pipe 66 and including an outer housing 90 having a square cross-section and defining an inner chamber 92. The S-shaped portion 82 includes five separate elements 94, 96, 98, 100 and 102 being coupled together at 90° turns and defining the S-shape. A sintered wicking material 104 is provided within the chamber 92 and contains a working fluid.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A planar heat pipe for removing heat from an electronic device, said heat pipe comprising:
    a planar portion with a central opening;
    a plate portion mounted to the electronic device; and
    a flexible serpentine portion coupled to the planar portion and the plate portion and being flexible in three-degrees of freedom, each of the planar portion, the plate portion and the serpentine portion including an internal chamber being in fluid communication with each other and containing a working fluid, the serpentine portion extends into the central opening of the planar portion.

2. The heat pipe according to claim 1 wherein the serpentine portion including a plurality of elements where each element is coupled to an adjacent element at substantially a 90° angle.

3. The heat pipe according to claim 1 wherein the serpentine portion includes at least five elements mounted to each other at a substantially 90° angle.

4. The heat pipe according to claim 1 wherein the serpentine portion is an S-shaped portion.

5. The heat pipe according to claim 1 wherein the planar portion has a general U-shape configuration where the serpentine portion and the plate portion are within the U-shaped planar portion.

6. The heat pipe according to claim 1 wherein the electronic device is one of a plurality of electronic devices mounted to a printed circuit board, said heat pipe including a plate portion and a serpentine portion coupled to the plate portion and the planar portion for each of the electrical devices.

7. The heat pipe according to claim 6 wherein the device is coupled to the printed circuit board by a ball, column or land grid array.

8. The heat pipe according to claim 6 wherein the printed circuit board has a space-based application.

9. The heat pipe according to claim 6 further comprising a spacer positioned between a cool end of the planar portion and the printed circuit board and defining a gap therebetween.

10. The heat pipe according to claim 1 wherein the electronic device is a field programmable gate array.

11. The heat pipe according to claim 1 wherein the chamber has a general square cross-sectional configuration.

12. A planar heat pipe for removing heat from a plurality of electronic devices mounted to a printed circuit board (PCB), said heat pipe comprising:
   a planar portion with a central opening;
   a plurality of plate portions where a separate plate portion is mounted to each electronic device;
   a plurality of serpentine portions where a separate serpentine portion is coupled to the planar portion and a plate portion, all of the planar portion, the plate portions and the serpentine portions including an internal chamber being in fluid communication with each other and containing a working fluid, each serpentine portion including a plurality of elements where each element is coupled to an adjacent element at substantially a 90° angle; and
   at least one spacer positioned between a cool end of the planar portion and the PCB and defining a gap therebetween.

13. The heat pipe according to claim 12 wherein each serpentine portion is an S-shaped portion.

14. The heat pipe according to claim 12 wherein each serpentine portion includes at least five elements mounted to each other at substantially 90° angle.

15. The heat pipe according to claim 12 wherein each device is coupled to the printed circuit board by a ball, column or land grid array.

16. An electronic hardware including a planar heat pipe and a printed circuit board (PCB) having a plurality of electronic devices mounted thereto, said heat pipe removing heat from the electronic devices, said heat pipe comprising:
   a planar portion with a central opening;
   a plurality of plate portions where a separate plate portion is mounted to each electronic device;
   a plurality of serpentine portions where a separate serpentine portion is coupled to the planar portion and a plate portion, all of the planar portion, the plate portions and the serpentine portions including an internal chamber being in fluid communication with each other and containing a working fluid, each serpentine portion including a plurality of elements where each element is coupled to an adjacent element at an angle; and
   at least one spacer positioned between a cool end of the planar portion and the PCB and defining a gap therebetween.

17. The hardware according to claim 16 wherein each serpentine portion is an S-shaped portion.

18. The hardware according to claim 16 wherein each serpentine portion includes at least five elements mounted to each other at substantially a 90° angle.

19. The hardware according to claim 16 wherein each device is coupled to the printed circuit board by a ball, column or land grid array.

* * * * *